United States Patent

Czajkowski et al.

[11] Patent Number: 6,064,555
[45] Date of Patent: *May 16, 2000

[54] RADIATION INDUCED SINGLE EVENT LATCHUP PROTECTION AND RECOVERY OF INTEGRATED CIRCUITS

[76] Inventors: David Czajkowski, 332 Alviso Way, Encinitas, Calif. 92023; James C. Marshall, 3985 Carveacre Rd., Alpine, Calif. 91903

[*] Notice: This patent issued on a continued prosecution application filed under 37 CFR 1.53(d), and is subject to the twenty year patent term provisions of 35 U.S.C. 154(a)(2).

[21] Appl. No.: 08/763,153

[22] Filed: Feb. 25, 1997

[51] Int. Cl.[7] .................................................. H01L 21/78
[52] U.S. Cl. ............................................................. 361/111
[58] Field of Search .................................. 361/18, 56, 57, 361/91, 93, 111, 119; 307/126, 131, 130; 376/254, 255; 257/372, 367

[56] References Cited

U.S. PATENT DOCUMENTS

| | | | |
|---|---|---|---|
| 4,687,622 | 8/1987 | Longden | 376/254 |
| 5,384,477 | 1/1995 | Bulucea . | |
| 5,441,900 | 8/1995 | Bulucea et al. . | |
| 5,552,338 | 9/1996 | Kang . | |
| 5,672,918 | 9/1997 | Kimbrough et al. | 361/57 |

OTHER PUBLICATIONS

M.P. Baze et al., "Latchup Paths in Bipolar Integrated Circuits", IEEE Transaction on Nuclear Science, Dec. 1986, vol. NS–33. No. 6.

A.H. Johnston, et al., "The Effect of Temperature on Single–Particle Latchup", IEEE Transaction on Nuclear Science, Dec. 1991, vol. 38, No. 6.

Song et al., "Parametric Investigation of Latch–Up Sensitivity in 1.25 μm CMOS Technology", IEEE Transactions on Nuclear Science, Dec. 1987, vol. NS–34 No. 6.

Primary Examiner—Jeffrey Gaffin
Assistant Examiner—Kim Huynh
Attorney, Agent, or Firm—Higgs Fletcher & Mack LLP; Bernard L. Kleinke

[57] ABSTRACT

An apparatus is disclosed for improving the Single Event Latchup (SEL) performance of an integrated circuit device (IC), or grouping of devices (as an example Multi-Chip Modules or MCMs), through the addition of active electronic circuitry integrated within the IC or MCM package. This circuitry and the protected device can be incorporated within the same physical dimensions and electrical configuration as the original integrated circuit device. The circuitry turns a destructive Latchup of a device into a recoverable event, allowing electronic devices that where unsuitable for the space environment due to SEL to be useable in the space environment.

20 Claims, 3 Drawing Sheets

RADIATION INDUCED SINGLE EVENT LATCHUP

INTEGRATED LATCHUP PROTECTION CIRCUIT
IN RADIATION SHIELDED PACKAGE

SIDE VIEW

RADIATION INDUCED SINGLE EVENT LATCHUP PROTECTION AND RECOVERY OF INTEGRATED CIRCUITS

BACKGROUND

Many of today's commercial integrated circuit (IC) devices and multi-chip modules (MCM) cannot be utilized in deep space and earth orbiting applications because of radiation induced single event latchup (SEL). The commercial IC devices are developed and manufactured for the computer and mass market applications and cannot withstand the effects of radiation induced single event latchup from either the natural space environment caused by solar flares, galactic cosmic radiation and the Van Allen electron and proton belts or man-made radiation induced events (neutrons and gamma radiation).

Common methods of preventing SEL degraded performance are to design special radiation tolerant integrated circuits. As an example Bulucea, et. al in U.S. Pat No. 5,441,900, Div. of U.S. Pat. No. 5,384,477, uses source/drain masks to locally implant the minority carrier lifetime reducer (MCLR) before the source/drain dopants are implanted. This requires control of the die mask production process and production of the die. Another method is to implement system level monitoring and system or sub-system level shutdown of latched circuitry. Kang in U.S. Pat. No. 5,552,338 uses a fuse to limit the current through the device. This has the disadvantage of being a non-recoverable latchup unless the fuse is reset.

Both of these solutions have performance and economic disadvantages. The inventions described herein provide improved SEL performance of an integrated circuit device, or grouping of devices (i.e. MCM) through the addition of active electronic circuitry integrated within the IC or MCM package. This circuitry and the protected device can be incorporated within the same physical dimensions and electrical configuration as the original integrated circuit device. The circuitry provides protection through the automatic limiting and removal of power during an SEL event, provides a sufficient off-time for the device to naturally reset from the event and automatically provides for power-up of the device. In addition, an SEL event monitoring signal can be added through the addition (or re-assignment) of one device output pin.

APPLICATIONS

The radiation induced SEL protection and recovery can be used to allow standard commercially available integrated circuits or grouping of circuits (MCMs), to meet the natural and man-made radiation hazards of the spacecraft environment, be it earth orbit, geostationary, or deep space probe. In this patent, a description is made of the technology and methodology to design and manufacture SEL immune integrated circuits and multi-chip modules utilizing standard commercial packaging technology. When combined with radiation hardened packaging technology, patent application Ser. No. 08/221,506 (submitted by same author David R. Czajkowski and David J. Strobel), this technology provides a SEL immune and total dose radiation hardened integrated circuit device.

BACKGROUND OF THE INVENTION

While the exact reasons for radiation induced single event latchup are not fully understood, a latchup can occur when a charged particle passes through the active region of an integrated circuit element, as shown in FIG. 1. A charge is then deposited along the path of the charged particle. When the charge collects within a specific region where a device is susceptible to SEL, usually at a depth of 10 micrometers, a latchup condition can be induced. Exact conditions creating latchup are dependent upon the particle type, energy level, device temperature and particle range. Integrated circuit device construction also plays an important role in determining whether a SEL event can occur; the doping level, substrate type, source-to-substrate/well contact spacing and holding voltages/current of internal transistors all can effect SEL tolerance levels. Similar phenomenon exists for causing SEL events with neutron and/or gamma radiation.

Common methods of preventing radiation induced single event latchup are to re-manufacture the integrated circuit on a silicon epitaxial substrate or utilize a different integrated circuit technology, such as, silicon on sapphire (SOS), silicon on insulator (SOI) or SIMOX. Remanufacture in different technologies often solves the SEL problem, but economic and technical performance penalties must be sustained when compared to commercial integrated circuits. Re-manufacture solutions also preclude commercial devices from being utilized in space applications.

Another method of solving the SEL condition is to monitor the power supply current of each individual (or group) of integrated circuits for increased and abnormal consumption and then cycle the power to the device or group of devices. The circuitry for this solution, involves placing an element in series with the power supply (such as a resistor), monitoring the output of the element with a circuit and then switching off power with an analog or electromechanical switch when current increases. This protection circuitry can involve many different circuit elements and packaged devices, which increases power, cost and physical space of the entire system. In addition, all of the circuit protection elements must also be able to withstand the effects of the radiation environment.

When an SEL event occurs, an increase in the power supply current is experienced by the integrated circuit device. In this state, the integrated circuit device often becomes non-functional and can even sustain permanent damage generally due to the increased supply current and resulting excess power dissipation of the integrated device. To remove the device from the latchup condition, the power supply must be removed or turned off within an interval before the latchup condition becomes destructive to the device. In a satellite without individual current monitoring circuitry, removing or cycling system power can be extremely difficult since the entire satellite may have to be shut down and the associated power supply filter capacitance must be discharged.

SUMMARY OF THE INVENTION

All the required circuitry to detect the latchup of a device, limit supply current increases remove power from the device, and restore power and device functionality are integrated within a single package along with the protected device. This solution eases the burden on the system by providing a transparent protection and recovery of the latchup sensitive device in a low cost, space and power efficient implementation.

The process begins with understanding the specific changes to the integrated circuit device during a SEL event. Normally, a device which is not immune to SEL phenomenon will exhibit increased supply current during the SEL event. A ground based heavy ion, proton, neutron or flash x-ray test is used to determine the integrated circuit electronic changes (power supply current and functionality) due to the event and the time interval that power must be removed from the device to recover from latchup. This data is used to determine the current threshold for the protection circuitry to remove power from the device, the time interval required before re-applying power to the device, and the current and voltage limits required on other input and output pins of the device to allow the latchup condition to release when power is removed from the supply pin.

The protection and recovery circuitry consists of a current sensor, a supply current switch, a comparator, a reference, a timer, and limiting circuitry as shown in FIG. 2 integrated in the same package as the device being protected. The current sensor and supply current switch are located in series with the package power supply pin and the protected device power supply pin. The comparator monitors the output of the current sensor and compares it to a reference threshold value which must be exceeded to trigger opening the current switch and removing the power supply from the device. The timer circuit restores the supply voltage to the device after a predetermined interval, and the limiting circuitry limits the voltage and/or current into selected pins of the device while power is removed.

This circuitry is either integrated with the device on a monolithic substrate or incorporated within the integrated circuit or Multi-Chip Module (MCM) package with one or more devices. One (1) protection and recovery circuit can be added to each integrated circuit component to be protected as shown in FIG. 3, or to groups of components to be protected. Multiple protection and recovery circuits may be added within a MCM to resolve potential latchup device supply current ambiguities. When integrated within the package, the exact configuration of the SEL protected device can be of any type (plastic, ceramic, metal, chip-on-board, or multi-chip module).

The process and design steps to achieve a SEL protected device using this approach are described in the Preferred Embodiment.

DESCRIPTION OF THE PREFERRED EMBODIMENT

1. Determine the radiation induced latchup characteristics of the integrated circuit device, using heavy ion, proton or flash x-ray testing. This can also be completed by IC circuit analysis, but the overall protection will be limited to the accuracy of the analysis. In particular, note the increase in supply currents from the normal operating mode to the "latched" state. The following parameters should be known and/or tested:

a. Supply current (ICC): the supply current in either the normal dynamic and/or static modes. Note: more than one supply voltage/current may be applicable.

b. Latched current (ILU): the increased level of current which is observed when the device is in radiation induced latchup.

c. Recovery time (tREC): the time interval which the power supply voltage must be removed from the device to allow the latchup condition to release.

d. Voltage (VIN0..n Max) and/or current (IIN0..n Max) limits on device pins to allow the latchup condition to release with the supply voltage removed from the device.

e. Single Event Latchup immunity of all protection devices. This will include SEL threshold testing of candidate parts using heavy ion, proton or flash x-ray testing where known data is not available.

2. Determine the operating temperature range (TA) of the integrated circuit to be protected. The selection of temperature range is based upon application requirements and is a criterion for selecting suitable components for the latchup protection and recovery circuit.

3. Design the latchup protection and recovery circuit elements as follows for the protection of a device with a positive voltage power supply input:

a. Select an integrated circuit current sensing element such as a series resistor which will provide a current to voltage conversion of the power supply current into the device to be protected. The sensing element must be chosen such that supply voltage drops due to the element are small compared to the supply tolerance under normal operating conditions. Current sensing can also be performed with a MOSFET device and/or integrated with the current switch element.

b. Select a current switch element such as a P-Channel FET which will exhibit sufficiently low on-resistance to exhibit a negligible drop in the supply voltage to the protected device, and input drive characteristics consistent with the rest of the protection and recovery circuitry. The current switch function could also be provided by an N-Channel FET. In certain situations it is preferable to crowbar the power supply current by connecting the power to ground rather then letting the power supply current float with a current switch.

c. Select or design a comparator circuit with sufficient sensitivity and accuracy to detect the change in device current between normal operation and latchup operation. The transient response of the circuit must be sufficient to rapidly detect the change in supply current corresponding to the latchup condition yet not trigger due to power up current into any on board or outboard decoupling capacitance on the protected device power supply input pin(s). A second comparator or a buffer (for drive capability) on the comparator output can be added to provide a status output to inform external circuitry that latchup protection has occurred.

d. Design a reference circuit, such as a resistive voltage divider of the supply voltage, which will provide a voltage input into the comparator corresponding to the desired latchup detection threshold current. This value is nominally set at half the sum of ILU (minimum) and ICC (maximum). The reference circuit can also be based on a zener diode reference or integrated reference such as a bandgap reference depending on the required accuracy of the reference voltage.

e. Design a timer circuit, such as an RC hysteresis network providing positive feedback to the comparator, which will reset the comparator after tREC and force the supply voltage to be re-applied to the protected device. The timer circuit may also be separate from the comparator consisting of a latch on the comparator output with a one shot to provide a reset after the recovery time interval. Depending on circuit topology, the output of the comparator or the output of the timer circuit is used to control the current switch.

f. Identify pins requiring protection and design limiting circuitry, such as a series resistors, which will limit the current into a device pin from an external device when power is removed from the protected device. Alternate protection schemes include diode clamps, analog switches, or tri-statable buffer gates which can control input voltages and currents within required limits when power is removed from the protected device.

g. Analyze the resulting circuitry for required modifications to the protected device specifications for power supply current, supply voltage tolerance, and AC and DC characteristics of device input pins with added limiting circuitry.

4. Partition, layout, fabricate, and test the design according to the electronic device technologies to be used. This would include the layout and fabrication of the Multi-Chip Module (MCM) substrate and/or package, and integrated devices (such as analog ASICs or custom semiconductor implementations of the protection and recovery circuitry). All devices are to be mounted within the final protected package. This is performed using industry standard tools and techniques.

5. An optional configuration is to mount the latchup protection and recovery circuitry with the protected device within a radiation shielded package (as described in patent application Ser. No. 08/221,506). This option enhances the total dose hardness of the single event latchup protected device and is shown in FIG. 3.

6. The latchup protection circuitry can use either discrete circuit elements or integrate the protection circuit into a single integrated circuit.

DETAILED DESCRIPTION OF THE INVENTION

Figure 1:
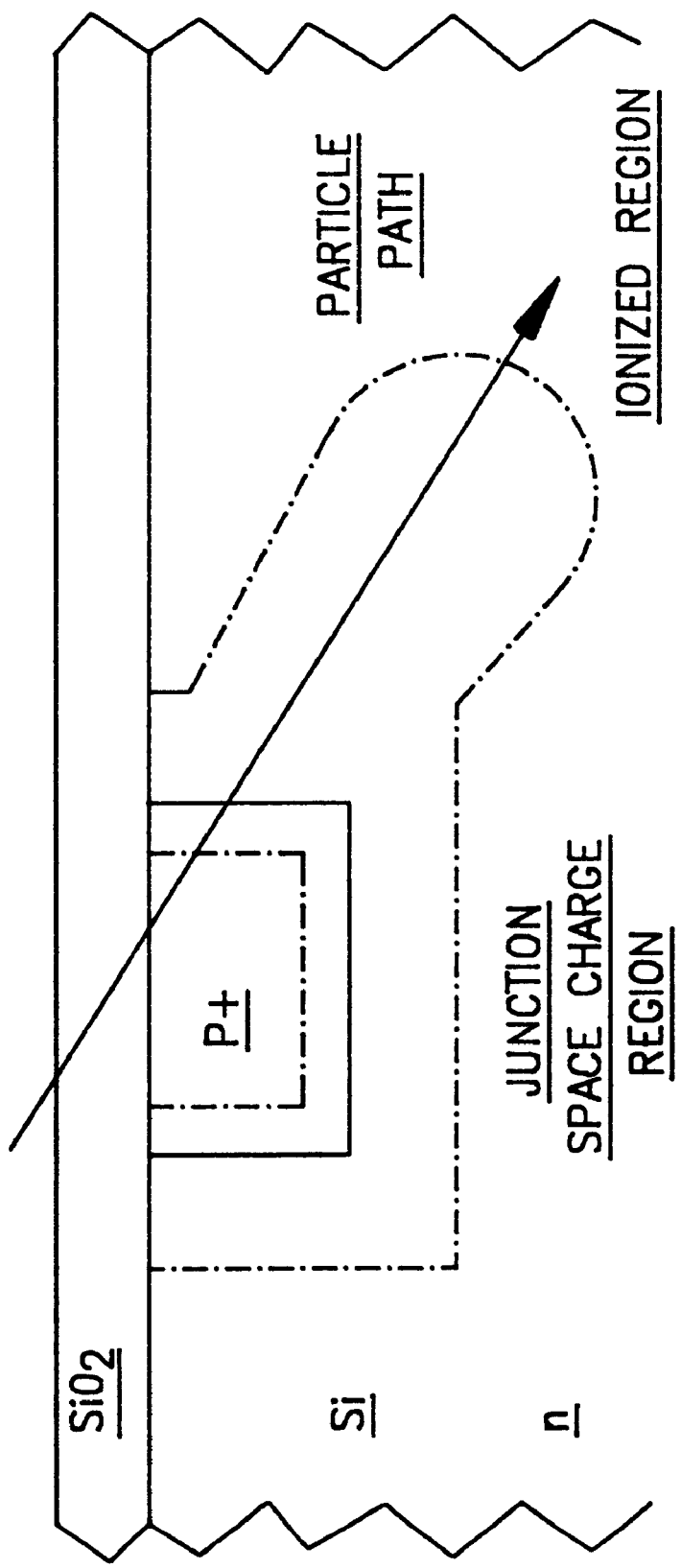
FIG. 1 is a side view of a radiation induced single event latchup to illustrate how a charged particle induces latchup in typical semiconductor device.
Figure 2:
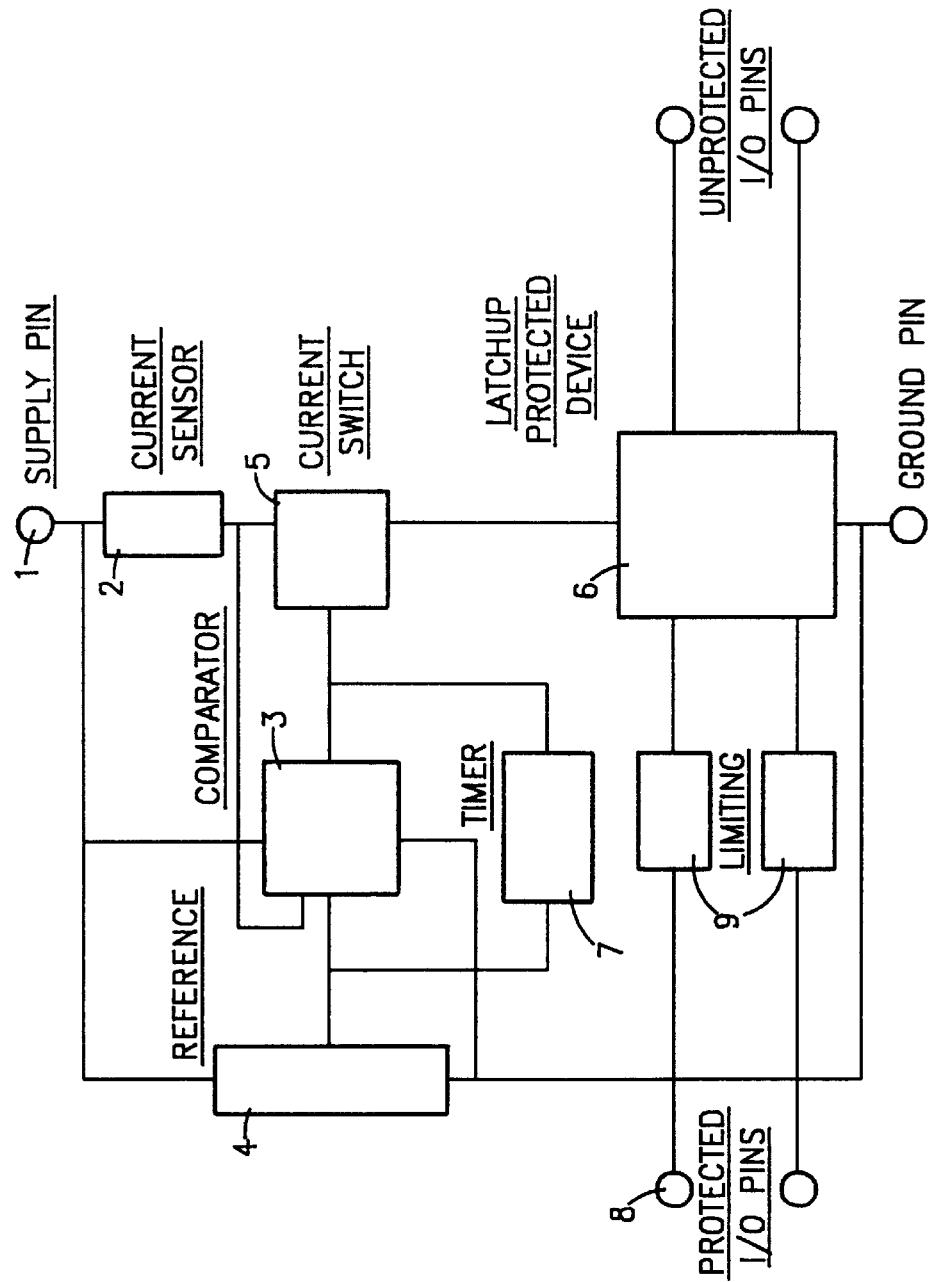
FIG. 2 is a schematic of a latchup protection circuit.

FIG. 2. is a schematic of a typical latchup protection circuit. In FIG. 2., the power supply current to the protected device 6 enters the device through the power supply input pins (ICC) 1. A current sensor element 2 provides a current to voltage conversion of the power supply current into the protected device 6. A comparator circuit 3 then determines the difference between the reference 4 and the sensed power supply current.

If the comparator circuit 3 determines that there is latchup, a current switch 5, controlled by the comparator circuit 3 shuts off the power to the protected device, for a predetermined time set by the timer 7. The timer 7, feeds back to the comparator circuit 3 and forces the supply voltage to be re-applied through the current switch 5.

The protected pin(s) 8 are connected to the protected device 6, through limiting circuitry 9, to limit the current into the protected pins 8 when power is removed from the protected device.

Figure 3:
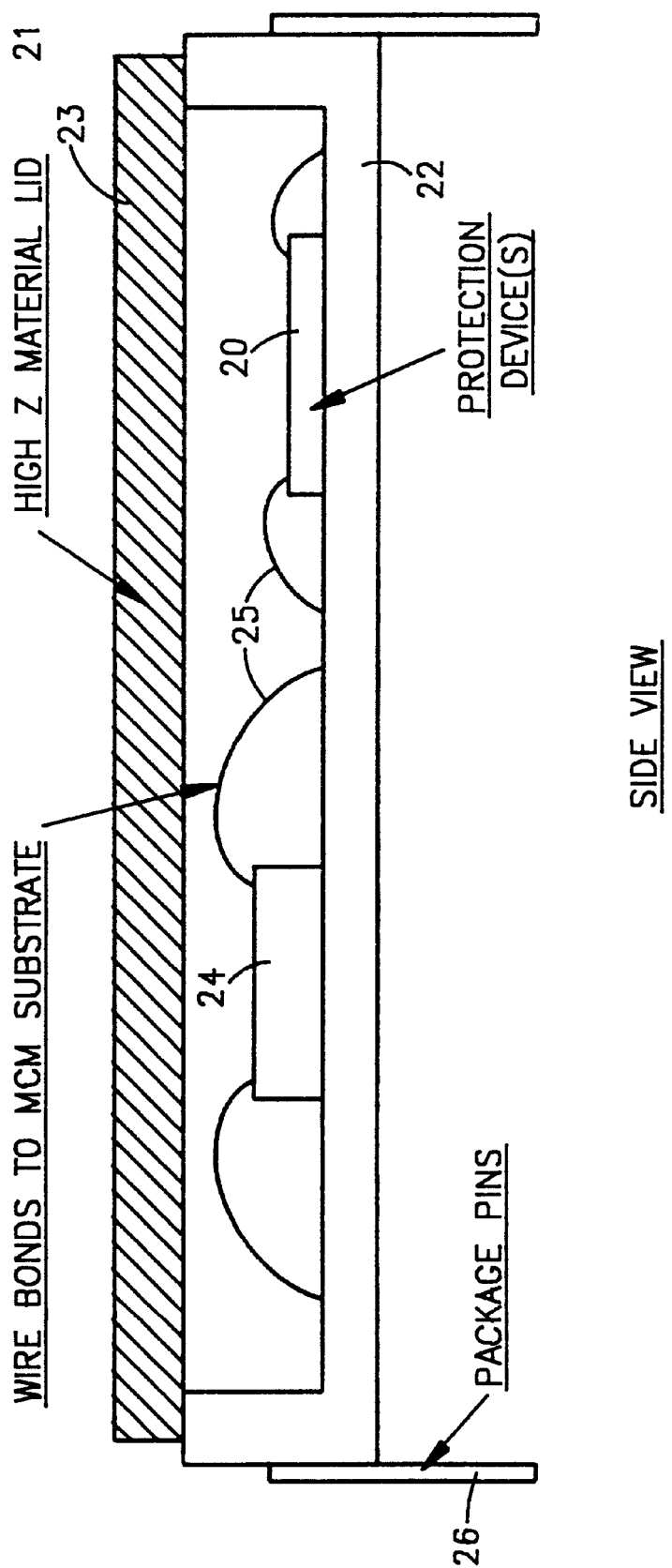
FIG. 3. is a side view of a typical application of the 1 latchup protection circuit of FIG. 2.

FIG. 3 is a side view of an latchup protection circuit integrated into a typical radiation shielded package. The latchup protection circuit 20 is set inside an IC package 21. The IC package 21 usually consist of a base member 22 and a lid member 23, however, there are many variations of package styles. In the preferred embodiment would be enclosed in a total dose radiation shielded package to also shield the devices from the effects of total dose radiation. The protected device(s) 24 are attached to the protection circuit 20 through wire bonds 25. The wire bonds 25 are attached to the package pins 26 through some method like a lead frame and or a substrate attached to the protected device attached to base member 22.

It should be understood that circuit design and package style are typical and are not meant to be all inclusive. There are many methods for current detection and timed or controlled power shutdown. Also many forms of circuit packaging are possible including MCM modules and monolithic devices where the protection circuit is included within the protected device.

What is claimed is:

1. A latchup protection and recovery circuit device for protecting and recovering a protected electronic device from single event induced latchup, which comprises:

(a) means for sensing the supply current of the protected electronic device, the electronic device having inputs and outputs;

(b) means for switching the supply current of the inputs and the outputs of the protected electronic device to an off state;

(c) means for determining when the sensed supply current indicates the presence of the single event induced latchup;

(d) means for controlling the switching means to place the protected electronic device in the off state, the means for controlling being responsive only to the determination that a single event induced latchup exists;

(e) means for timing the switching of the supply current, of the inputs and the outputs of the protected circuit, so as to return the protected device to it's operating state; and (f) wherein said latchup protection and recovery circuit device and said protected electronic device are within a single integrated circuit package.

2. A latchup protection and recovery circuit device in claim 1, wherein the single event latchup is induced by neutron or gamma radiation.

3. A latchup protection and recovery circuit device in claim 1, further comprising means for attaching multiple supply pins to said protected electronic device.

4. A latchup protection and recovery circuit device in claim 1, wherein multiple said latchup protection and recovery circuit devices attach to multiple protected electronic devices.

5. A latchup protection and recovery circuit device in claim 4, wherein said multiple integrated circuit devices are within a single multi-chip module package.

6. A latchup protection and recovery circuit device in claim 1, wherein said latchup protection and recovery circuit device is attached to positive and/or negative power supply pins on said protected electronic device.

7. A latchup protection and recovery circuit device in claim 1, wherein said means for sensing is responsive to a latchup event notification signal.

8. A latchup protection and recovery circuit device in claim 5, wherein said means for sensing is responsive to a latchup event notification signal.

9. A latchup protection and recovery circuit device in claim 1, wherein said package is composed of a ionizing radiation shielding material.

10. A latchup protection and recovery circuit device in claim 9 where said package is composed of an ionizing radiation shielding material.

11. A latchup protection and recovery circuit device in claim 1, wherein said latchup protection and recovery circuit device is integrated onto a monolithic semiconductor device with said protected electronic device.

12. A latchup protection and recovery circuit device in claim 1, wherein said latchup protection and recovery circuit device incorporates a current sensor, a voltage reference and a comparator circuit to determine if a latchup has occurred.

13. A latchup protection and recovery circuit device in claim 12, wherein said latchup protection and recovery circuit device incorporates a power re-applying circuit to reapply power supply voltage to said protected electronic device to return the protected electronic device to its operating state.

14. A latchup protection and recovery circuit device in claim 13, wherein said power re-applying circuit uses a timer to re-apply the power supply voltage to said protected electronic device to return the protected electronic device to its operating state.

15. A latchup protection and recovery circuit device in claim 12, wherein said protected electronic device has a current limiting circuitry attached that limits the current into said protected electronic device.

16. A latchup protection and recovery circuit device in claim 1, wherein said latchup protection and recovery circuit device is integrated into a single integrated circuit device.

17. A latchup protection and recovery circuit device in claim 1, wherein said latchup protection and recovery circuit device includes a package substrate, and a substrate is mounted within said package substrate.

18. The latchup protection and recovery circuit device according to claim 1 wherein said single package includes a substrate, with said latchup protection and recovery circuit device and said protected electronic device mounted on said substrate, and further including a radiation shielding lid extending over the devices and substrate for shielding the devices against ionizing radiation.

19. The latchup protection and recovery circuit device according to claim 18 wherein the lid further includes high Z material.

20. A latchup protection and recovery circuit device for protecting and recovering a protected electronic device from a single event induced latchup, the protected electronic device for use in outer space, comprising:

(a) means for sensing the supply current of the protected electronic device;

(b) means for switching the supply current of the protected electronic device to place the protected electronic device in an off state;

(c) means for determining when the sensed supply current indicates the single event induced latchup is occurring in the protected electronic device;

(d) means for controlling the switching means to place the protected electronic device in the off state, the means for controlling being responsive only to the determination that the single event induced latchup exists;

(e) means for timing the switching of the supply current to return the protected electronic device to it's operating state after a period of time;

(f) wherein said latchup protection and recovery circuit device and said protected electronic device are within a single integrated circuit package; and (g) wherein the single package comprises a high Z material to shield against space radiation.

* * * * *